United States Patent [19]
Abudayyeh et al.

[11] Patent Number: 6,081,858
[45] Date of Patent: Jun. 27, 2000

[54] APPARATUS AND METHOD FOR SHAPING RANDOM WAVEFORMS

[75] Inventors: Jihad Abudayyeh; Sanjiv Pathak, both of Fremont, Calif.

[73] Assignee: Cirrus Logic, Inc., Fremont, Calif.

[21] Appl. No.: 08/979,188

[22] Filed: Nov. 26, 1997

[51] Int. Cl.[7] .................................................. G06F 13/00
[52] U.S. Cl. .......................... 710/102; 327/94; 341/122
[58] Field of Search ................................ 710/102, 103; 327/91, 94, 109; 341/122; 388/901

[56] References Cited

U.S. PATENT DOCUMENTS

4,862,094  8/1989  Wetzel et al. ............................ 324/500
5,844,484  12/1998  Fujiuchi et al. ......................... 340/572.1

*Primary Examiner*—John A. Follansbee
*Attorney, Agent, or Firm*—Frank D. Nguyen; Victor Okumoto; Peter T. Rutkowski

[57] ABSTRACT

A method and circuit to regulate a random waveform signal to ensure that the LED indicator driven by the waveform signal is visible to the human eye is provided. The method and circuit first determines whether there is a pulse occurring. If an on-going pulse is detected, the regulated waveform signal is driven HIGH for at least 8 clock cycles. If no on-going pulse is detected, the regulated waveform signal is driven LOW for at least 8 clock cycles.

16 Claims, 8 Drawing Sheets

APPARATUS AND METHOD FOR SHAPING RANDOM WAVEFORMS

FIELD OF THE INVENTION

The invention generally relates generally to Personal Computer Memory Card International Association (PCMCIA) standard peripheral cards or PC cards, and more particularly to PCMCIA card transaction activities indicator circuits.

BACKGROUND OF THE INVENTION

Personal Computer Memory Card International Association (PCMCIA) peripheral cards, which later became known as PC peripheral cards, are used to vary the capabilities of a computer system or other electronic equipment. At approximately the size of a credit card that is generally connected to a peripheral device at one end, PC peripheral cards can be plugged on the fly into expansion slots coupled to the system bus thereby adding desired functions to personal computer systems or handheld computer systems. Examples of the kinds of peripheral devices that can be added to computer systems or electronic equipment via PC peripheral cards include communications devices (e.g., modems, ethernet networks, etc.), add-on memory devices, multimedia devices, hard drive controllers, and floppy drive controllers. In short, PC peripheral cards act as an interface to allow data to be transferred between the peripheral device and the computer system or electronic equipment.

PC peripheral cards can either follow the architecture in the PC specification Revision 2.1 (hereinafter R2 architecture) or the PC Cardbus specification (hereinafter Cardbus architecture). A few highlighted distinctions between the two architectures include while the R2 PC peripheral cards support 16-bit operations, the Cardbus PC peripheral cards support 32-bit operations and provide bus mastering capability. Architecturally, a PC peripheral card generally consists of a connector that interfaces to an integrated circuit board embodying the function (e.g., a floppy drive controller) to be carried out by the PC peripheral card.

For a PC peripheral card to function, it must be completely inserted into an extension slot of the computer system. As such, an indicator (e.g., a beeping sound) is provided to alert the end user that the PC peripheral card has been properly inserted and is ready for operation. However, it may be minutes from the time the PC card is inserted into the extension slot until the end user executes a command (e.g., read or write operation) to transfer data between the peripheral device and the computer system via a PC peripheral card. Accordingly, some kind of indication is desirable to signal to the end user that the PC peripheral card is functioning during the data transfer operation since he may have forgotten whether the PC peripheral card has been properly inserted. Moreover, even if the PC peripheral card has been properly inserted such indication signal is still needed because the PC card may be malfunctioned. The indication signal is desirable because the transfer data may be lost if the end user is not aware that the PC peripheral card has not been properly inserted or is malfunctioned.

In the Prior Art, an LED circuit is provided as a visual indication of the data transfer operation. Normally unlit, the LED is lit when a data transfer operation occurs. As a result, the LED flickers when data transfer operations occur in series. However, given the current speed of computer processors and peripheral devices, the duration of a read or write transaction may be in micro-seconds or less. As such, the LED flickering rate may be too fast for the human eye to recognize which drastically reduces the effectiveness of the visual effect intended.

Hence, there is a need for an apparatus, system, and method to reduce the flickering rate of the LED circuit so that the effectiveness of the visual effect intended can be maximized.

SUMMARY OF THE INVENTION

Accordingly, the present invention provides an apparatus, system, and method to regulate the transaction activity signal so that the flickering rate of the LED circuit can be reduced.

The present invention meets the above need with a waveform signal regulating circuit. In general, the waveform signal regulating circuit first determines whether there is a pulse occurring. If an on-going pulse is detected, the regulated waveform signal is driven HIGH for at least 8 clock cycles. If no on-going pulse is detected, the regulated waveform signal is driven LOW for at least 8 clock cycles. In so doing, the LED is alternately lit for an visible period then goes low for a visible period.

The waveform signal regulating circuit comprises: a sample-and-hold circuit and a latch coupled to the sample-and-hold circuit. The sample-and-hold circuit receives as input a waveform signal. From the waveform signal, the sample-and-hold circuit detects whether there is any on-going transaction activity. If there is an on-going activity, the sample-and-hold circuit determines if a pulse is occurring in the waveform signal. If a pulse is not occurring in the waveform signal, the sample-and-hold circuit triggers the latch to assert a HIGH state in the regulated waveform signal for at least 8 clock cycles. If the pulse in the waveform signal is occurring, the sample-and-hold circuit continues to monitor transaction activities.

Conversely, if there is no on-going activity, the sample-and-hold circuit also determines if a pulse is occurring in the waveform signal. If a pulse is not occurring in the waveform signal, the sample-and-hold circuit triggers the latch to assert a LOW state in the regulated waveform signal for at least 8 clock cycles. If the pulse in the waveform signal is occurring, the sample-and-hold circuit continues to monitor transaction activities.

The sample-and-hold circuit is constructed using a first counter, a second counter, and a switching circuit. The first counter is coupled to the latch and is used in monitoring a first count in response to the regulated waveform signal. The first counter generates a signal having the first state while the first count is less than 8. Conversely, the first counter generates the signal having a second state when the first count reaches the value 8.

The second counter is coupled to the latch and is used in monitoring a second count in response to a complementary of the regulated waveform signal. The second counter generates a signal having the first state while the second count is less than the value 8. Conversely, the second counter generates the signal having the second state when the second count reaches the value 8.

The switching circuit receives as inputs the waveform signal and the signals generated by the first and second counters. The switching circuit outputs a first and second output signals in response to the waveform signal and the signals generated by the first and second counters. The first and second output signals from the switching circuit are then provided as inputs to the latch.

All the features and advantages of the present invention will become apparent from the following detailed description of its preferred embodiment whose description should be taken in conjunction with the accompanying drawings.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

In reducing the flickering rate of LEDs indicating the occurrence of transaction activities on inserted PC cards, the duration of pulses representing the transaction activities as well as the gaps between these pulses are regulated such that they attain a minimum predetermined length. In so doing, the LEDs stay lit and unlit for durations that allow the end user to observe the visual cue. In accordance with the present invention, some pulses that occur too close in succession of the pulse currently being sampled are ignored so that the above objective can be obtained.

Figure 1:
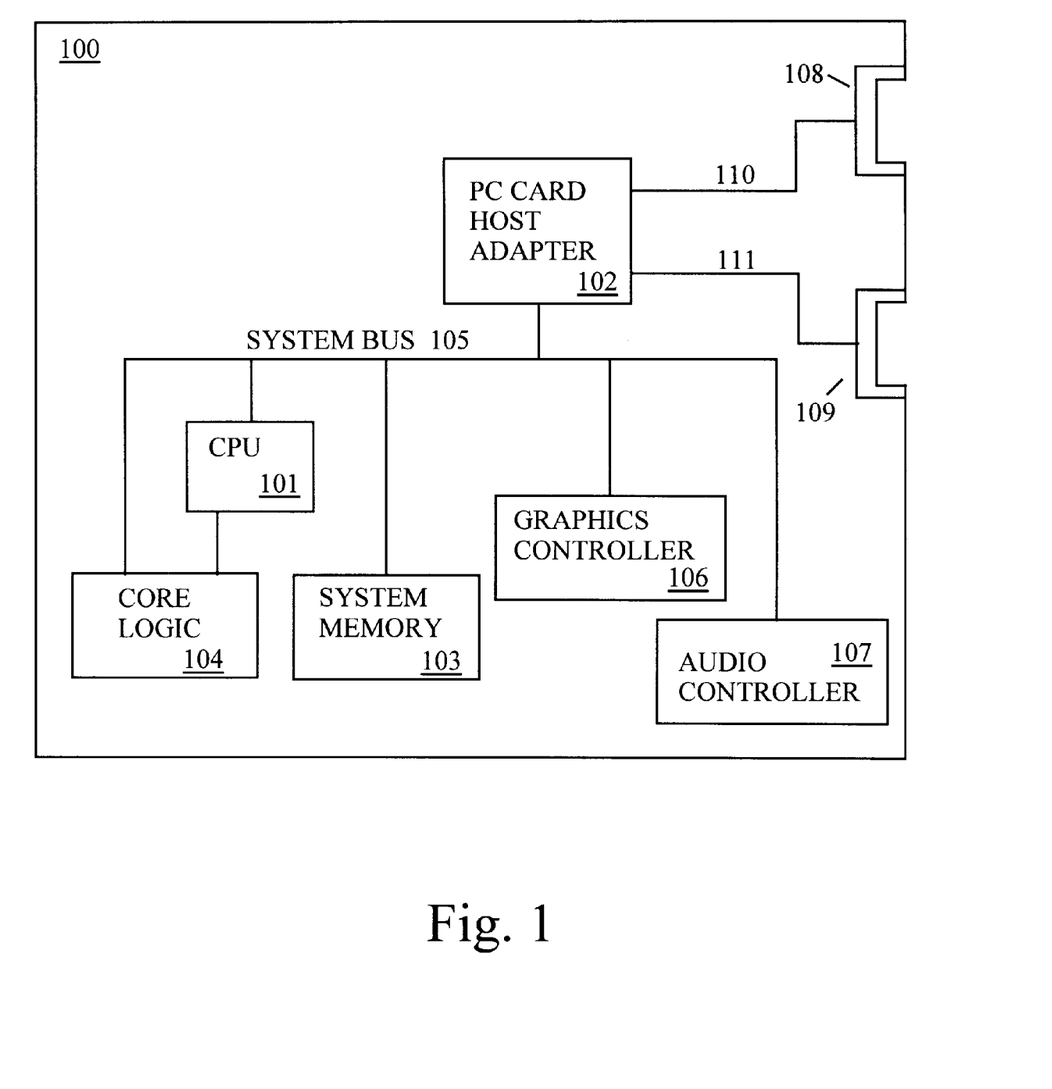
FIG. 1 is a block diagram illustrating a typical computer system that has PC Card capability and utilizes aspects of the present invention.

Reference is now made to FIG. 1 illustrating a block diagram of computer system 100 utilizing aspects of the present invention. Computer system 100 comprises central processor unit (CPU) 101, PC card host adapter 102, system memory 103, core logic 104, system bus 105, video/graphics controller 106, and audio controller 107. System bus 105 couples CPU 101, PC card host adapter 102, system memory 103, core logic 104, graphics controller 106, and audio controller 107 together. In the preferred embodiment, system bus 105 is a Peripheral Component Interconnect (PCI) bus. Core logic 104 is also coupled directly to CPU 101 and aids CPU 101 in determining which subsystem gets control of system bus 105 at any given time. PC card host adapter 102 is coupled between system bus 105 and one end of PC card interface buses 110 and 111. The other ends of PC card interface buses are connected to PC card expansion slots 108 and 109, respectively.

Since system bus 105 may be different from PC card interface bus 110 and 111 in many aspects, PC card host adapter 102 provides the interface necessary between system bus 105 and PC card interface buses 110 and 111. First, the number of address and data lines in system bus 105 may be different than the number of address and data lines in PC card interface buses 110 and 111. Second, the control signals required at PC card expansion slots 108 and 109 to adapt to the different PC card types may not be included in system bus 105. Most importantly, the data transfer rate across system bus 105 may be different than the data transfer rate across PC card interface buses 110 and 111.

Video/graphics controller 106 and audio controller 107 are used to process video and audio data, respectively, prior to sending the processed data for output to monitor/display and speakers. Preferably, the hardware implementing the present inventions resides inside PC card host adapter 102. In accordance with the present invention, PC card host adapter 102 provides two signal lines LED1 and LED2 to an LED circuit (not shown) which actuates the LED to indicate on-going PC card transaction activities.

Figure 2:
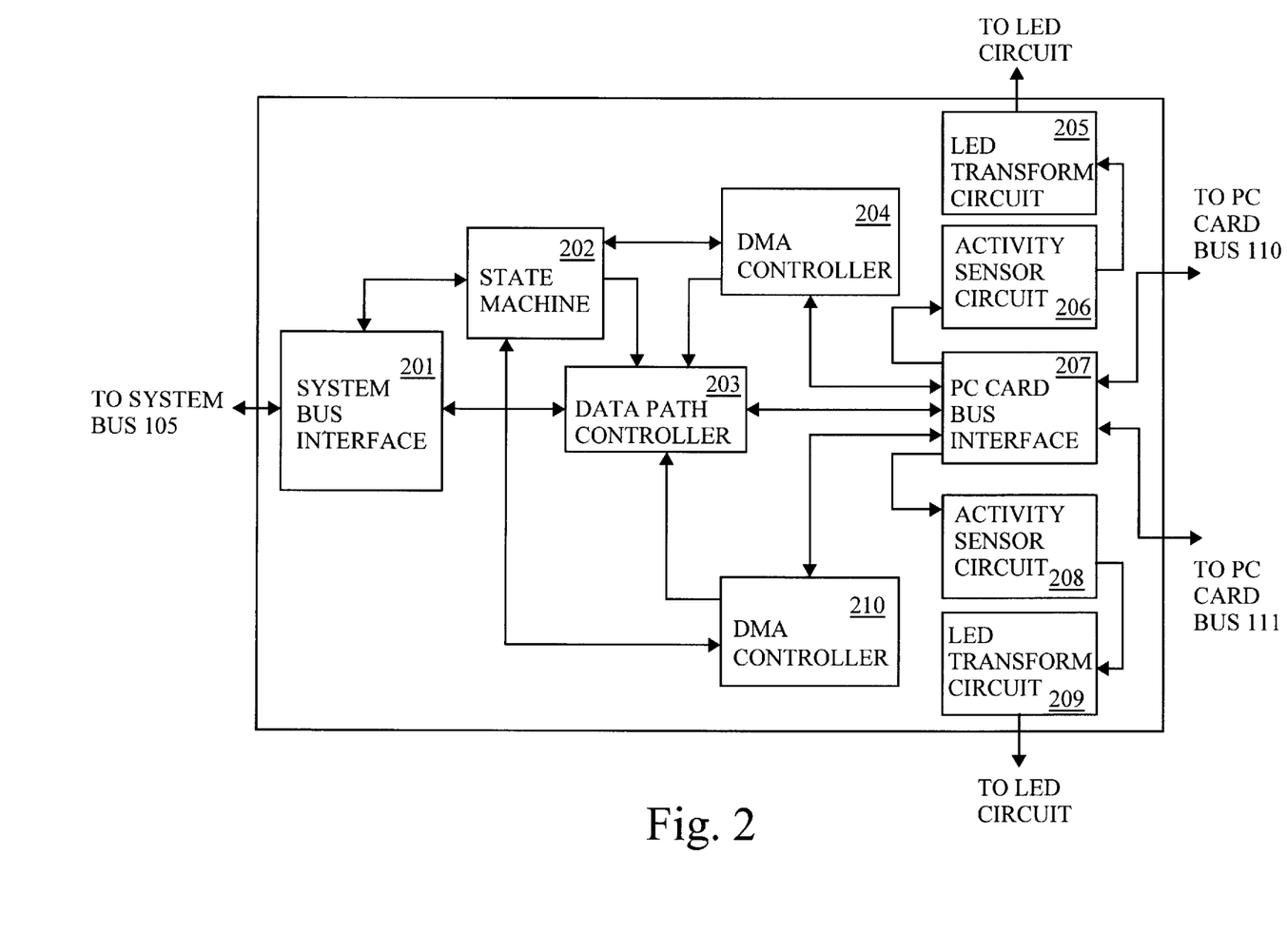
FIG. 2 is a block diagram illustrating the PC Card host adapter implemented in the computer system of FIG. 1 in accordance with the present invention.

Referring to FIG. 2 illustrating in more details PC card host adapter 102, PC card host adapter 102 comprises system bus interface 201, state machine 202, data path controller 203, DMA controller 204, LED transform circuit 205, activity sensor circuit 206, PC card bus interface 207, activity sensor circuit 208, LED transform circuit 209, and DMA controller 210. PC card host adapter 102 includes two sets of activity sensor circuit and LED transform circuit because it is designed to handle two PC peripheral cards at any given time. PC card host adapter 102 is designed to handle both R2-type PC cards and Cardbus-type PC cards.

System bus interface 201 provides an electrical connection to system bus 105. Additionally, in interfacing with system bus 105, system bus interface 201 ensures that the necessary bus protocols are met. System bus interface 201 also allows memory address space mapping and I/O address space mapping over system bus 105. PC card bus interface 207 provides an electrical connection to PC card buses 110 and 111. Moreover, in interfacing with PC card buses 110 and 111, PC card interface 207 ensures that the necessary bus protocols are met.

In general, state machine 202 acts as the overseer for PC card host adapter 102. Some of the tasks that state machine 202 handles include: determining whether host adapter 102 functions in a master or slave mode, negotiating for control of system bus 105, generating interrupts when required, and communicating status and control commands with the other components inside PC card host adapter 102.

Using the commands and control signals provided by state machine 202, data path controller 203 determines and controls the data paths and directions between system bus 105 and PC card interface buses 110 and 111. Under the command and control of state machine 202, DMA controller 204 carries out direct memory access (DMA) data transfer between computer system 100 and the peripheral device connected to expansion slot 108 via system bus 105 and PC card bus 110, respectively. DMA controller 204 includes capability for buffering DMA data to prevent data loss during transfer. Similarly, DMA controller 205 carries out direct memory access (DMA) data transfer between computer system 100 and the peripheral device connected to expansion slot 109 via system bus 105 and PC card bus 111, respectively. DMA controller 205 also includes capability for buffering DMA data to prevent data loss during transfer.

In accordance with the present invention, when activity sensor circuit 206 detects a data transfer (a.k.a. a bus transaction) activity such as a read or a write operation occurring on PC card bus 110, it generates a pulse and outputs such pulse in a signal to LED transform circuit 205. The width of the pulse generated directly correlates to the duration of the transaction. Similarly, the gap between two successive pulses directly correlates to the time between two successive transaction activities. Hence, the wave form of the signal generated by activity sensor circuit 206 may be random over time. Upon receiving the signal generated by activity sensor circuit 206, LED transform circuit 205 regulates the waveform in accordance to the present invention and provides the regulated signal to LED circuit for display. Activity sensor circuit 208 and LED transform circuit 209 perform the same functions as their counterparts (i.e., activity sensor circuit 208 and LED transform circuit 209) for transaction activities occurring on PC card bus 111. For the sake of brevity as well as clarity, activity sensor circuit 208 and LED transform circuit 209 are not discussed any further.

Figure 3:
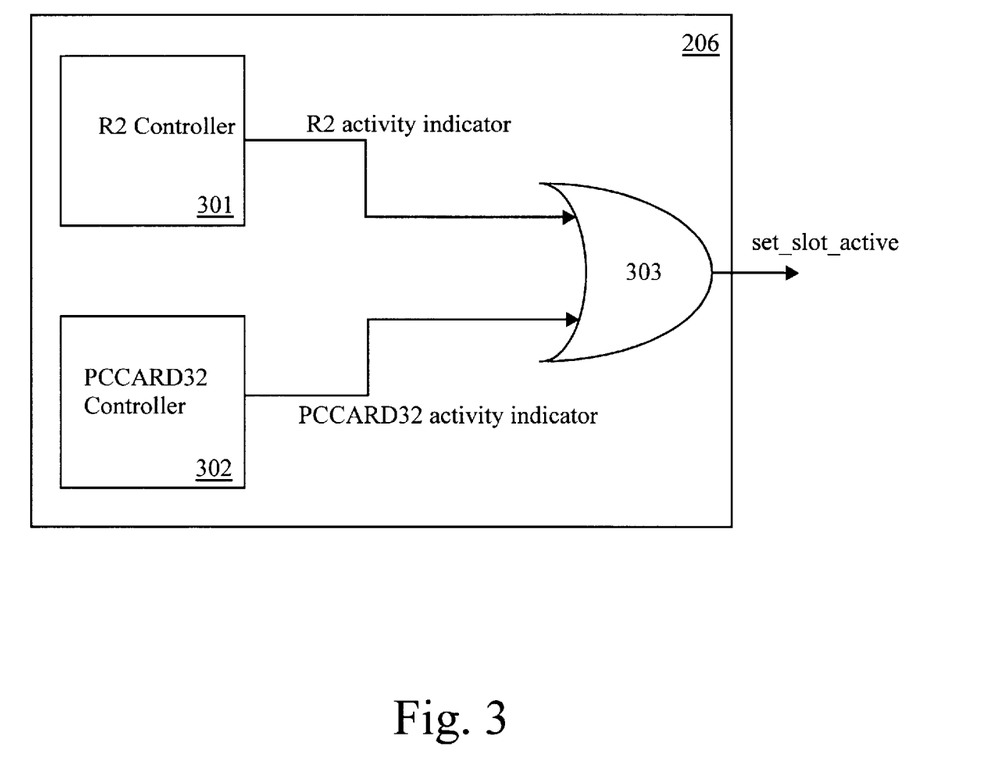
FIG. 3 is a block diagram illustrating the activity sensor circuit in the PC Card host adapter of FIG. 2.

FIG. 3 illustrates in more detail a block diagram of activity sensor circuit 206. As shown in FIG. 3, activity sensor circuit 206 comprises R2 controller 301, PC card32 controller 302, and OR-gate 303. R2 controller 301 is designed to detect transaction activities on PC card expansion slot 108 if the PC card inserted is an R2 card (R2 mode). Accordingly, R2 controller 301 receives as input card enable signals CE1 and CE2 from PC card bus interface 207. Signals CE1 and CE2 are driven LOW during transaction cycle to enable data access. While signal CE1 enables even-numbered address bytes, CE2 enables odd-numbered address bytes. When either or both signals CE1 and CE2 are LOW indicating a transaction activity is occurring, R2 controller 301 generates a pulse. The width of the pulse generated directly correlates to the duration of the transaction. Similarly, the gap between two successive pulses directly correlates to the time between two successive transaction activities. R2 controller 301 provides the signal it generated as an input to OR-gate 303. It is clear that a circuit like R2 controller 301 is well-known. As such, its design should be obvious to a person of ordinary skill in the art.

On the other hand, PC Card32 controller 302 is designed to detect transaction activities on PC card expansion slot 108 if the PC card inserted is a Cardbus (Cardbus mode). Accordingly, PC Card32 controller 302 receives as input a card enable signal CFRAME# from PC card bus interface 207. Signal CFRAME# is driven LOW to indicate that a bus transaction is beginning. While signal CFRAME# is asserted, data transfers continue. When signal CFRAME# is deasserted, the transaction is in its final phase. As such, when signal CFRAME# is asserted LOW, PC Card32 controller 302 generates a pulse. The width of the pulse generated directly correlates to the duration of the transaction. Similarly, the gap between two successive pulses directly correlates to the time between two successive transaction activities. PC Card32 controller 302 provides the signal it generated as a second input to OR-gate 303. It is clear that a circuit like PC Card32 controller 302 is well-known. As such, its design should be obvious to a person of ordinary skill in the art.

Pulse signals generated by R2 controller 301 and PC Card32 controller 302 are provided as input to OR-gate 303. In so doing, OR-gate 303 acts as a comparator to allow HIGH values from the input pulse signals to pass through to the output. OR-gate 303 provides as the output signal set_slot_active.

As discussed above, activity sensor circuit 208 monitors transaction activities on PC card bus 109. Since activity sensor circuit 208 performs the same functions as activity sensor circuit 206, activity sensor circuit 208 is constructed substantially the same as its counterpart. For brevity as well as clarity, activity sensor circuit 208 is not discussed any further.

Figure 4:
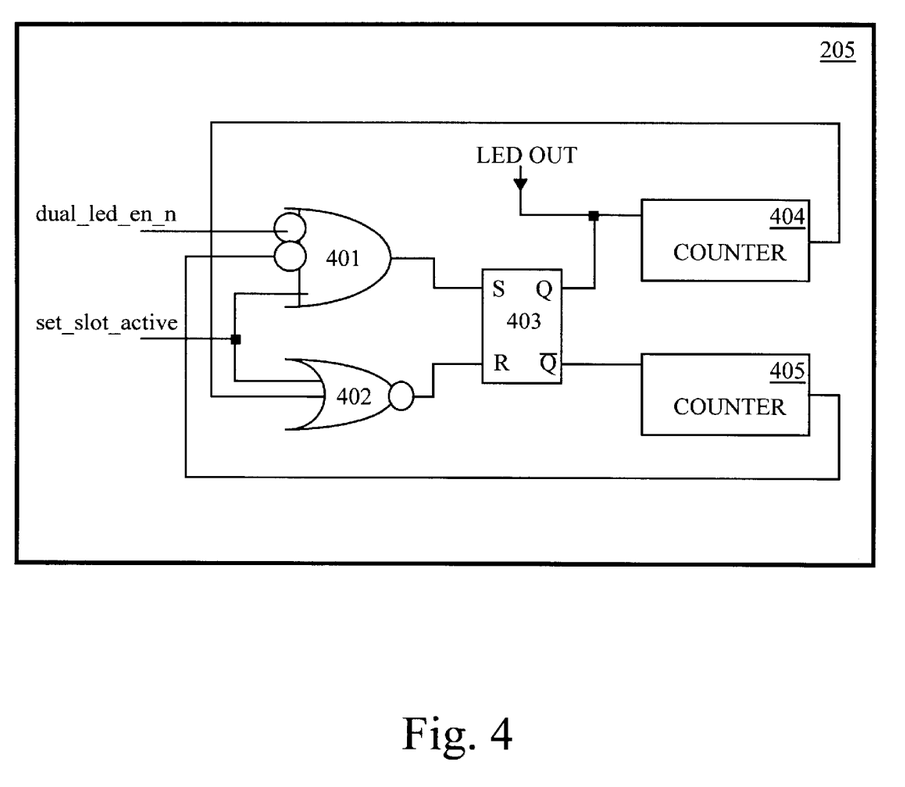
FIG. 4 is a block diagram illustrating the LED transform circuit in the PC Card host adapter of FIG. 2 in accordance with the present invention.

Signals set_slot_active generated by activity sensor circuits 206 and 208 are then provided as input to LED transform circuits 205 and 209, respectively, to be transform into waveform signals which can be converted into LED signals that are not too fast for the human eye. Referring now to FIG. 4 illustrating a gate-level diagram of LED transform circuit 205, LED transform circuit 205 comprises: AND-gate 401, NOR-gate 402, RS-type latch 403, counter 404, and counter 405. Counters 404 and 405 are substantially similar and are both designed to operate as follows. Each counter starts a new count when it receives a HIGH input signal. The count is incremented by one for each successive clock signal. When the count reaches eight (8), the count is reset to zero (0). When the count is being kept (i.e., the count is not equal to zero), the counter outputs a HIGH signal. When the count is reset, the counter outputs a LOW signal.

As shown in FIG. 4, the invert of signal dual_led_en_n is provided as an input to AND-gate 401. Signal dual_led_en_n is supplied from a control register inside PC card host adapter 102 when a predetermined bit of the control register is set. Preferably, signal dual_led_en_n is asserted LOW to enable LED transform circuit 205. As such, signal dual_led_en_n is inverted before it is supplied as an input to AND-gate 401. Signal set_slot_active from activity sensor circuit 206 is supplied as a second input to AND-gate 401. A third input to AND-gate 401 is the invert of the output from counter 405. AND-gate 401 provides its output to the S input of RS-type latch 403.

NOR-gate 402 receives as an input signal set_slot_active from activity sensor circuit 206. As a second input, it receives the output from counter 404. NOR-gate 402 provides its output to the R input of RS-type latch 403. RS-type latch 403 provides its output as an input to counter 404. The output of RS-type latch 403 is also the output of LED transform circuit 205. The complement output of RS-type latch 403 is provided as an input to counter 405.

As an illustration of how LED transform circuit 205 operates, assume that initially the LED transform circuit 205 is enabled because signal dual_led_en_n is asserted LOW (0) and a transaction activity is detected resulting in a HIGH (1) set_slot_active signal. Since counter 405 is initially reset, counter 405 outputs a LOW (0) signal which is inverted and provided as an input to AND-gate 401. Accordingly, AND-gate 401 outputs a HIGH (1) signal to the S input of RS-type latch 403. At the same time, NOR-gate 402 outputs a LOW signal to the R input of RS-type latch 403 since signal set_slot_active signal is HIGH regardless of the value of the output of counter 404. As such, the output of RS-type latch 403 is set to one (1) (HIGH) which is provided as the output of LED transform circuit 205. The HIGH output from latch 403 also triggers counter 404 to start counting. Counter 404 also outputs a HIGH signal. Since the complement output of RS-type latch is zero (0), counter 405 remains reset (clear) which results in a LOW signal at its output. Given the characteristics of a RS-type latch, the combined effect is that the output of LED transform circuit 205 remains HIGH for 8 clock cycles. Hence, any sign of transaction activity detected during these 8 clock cycles is ignored.

When the count of counter 404 reaches the value eight (8), the count is reset to zero and counter 404 outputs a LOW signal to NOR-gate 402. In so doing, if signal set_slot_active becomes LOW due to transaction inactivity at this time, NORgate 402 outputs a HIGH signal at the input R of RS-type latch 405. Moreover, if signal set_slot_active becomes LOW, the output of AND-gate 401 also goes LOW. The combined effect is that the output of RS-type latch 403 as well as the output of LED transform circuit 205 becomes LOW. Consequently, counter 404 is reset and outputs a LOW signal and counter 405 starts counting and outputs a HIGH signal. The combined effect is that the output of LED transform circuit 205 remains LOW for 8 clock cycles. Hence, any sign of transaction activity detected during these 8 clock cycles is ignored.

By holding the output of LED transform circuit 205 to a HIGH or LOW state for 8 clock cycles, the LED flickering rate is minimized thereby ensuring the visual effect intended for the end-user which is to indicate transaction activity across the PC card. As discussed above, LED transform circuit 209 regulates the LED waveform signal generated by activity sensor circuit 208. Since LED transform circuit 209 performs the same functions as LED transform circuit 205, LED transform circuit 209 is constructed substantially the same as its counterpart. For brevity as well as clarity, LED transform circuit 209 is not discussed any further.

Figure 5A:
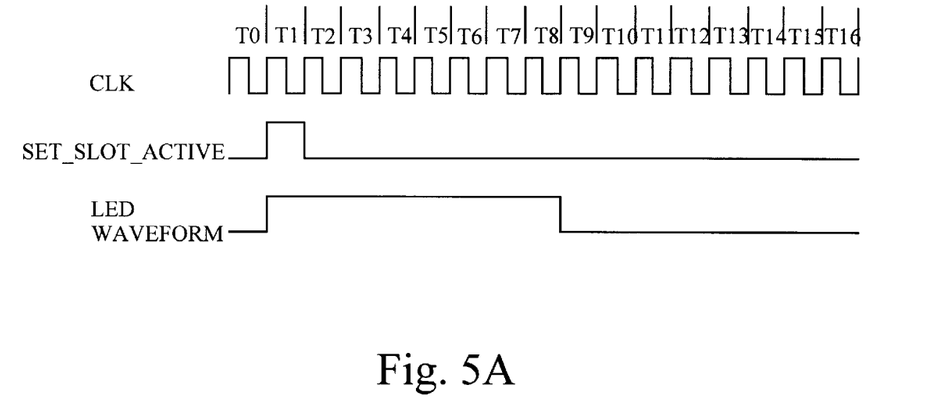
FIGS. 5A–5F are exemplary waveform diagrams illustrating the input and output signals of the LED transform circuits in FIG. 4 in accordance to the present invention.

Reference is now made to FIGS. 5A–5F illustrating exemplary timing diagrams of LED transform circuits 205 and 209 in accordance to the present invention. FIG. 5A illustrates a single pulse representing a single transaction activity (signal set_slot_active), generated by one of the activity sensor circuits, which is provided as an input to an LED transform circuit in accordance with the present invention. The transaction activity pulse has a duration of one clock cycle. In response, the LED transforms circuit transform the one-clock-cycle pulse into an eight-clock-cycles pulse. In other words, the LED waveform signal (the output of the LED transform circuit) goes HIGH starting at time T1. Starting at time T9, the pulse goes LOW. In so doing, the LED is forced to stay lit for a longer duration thereby allowing the end user to observe the visual cue.

Figure 5B:
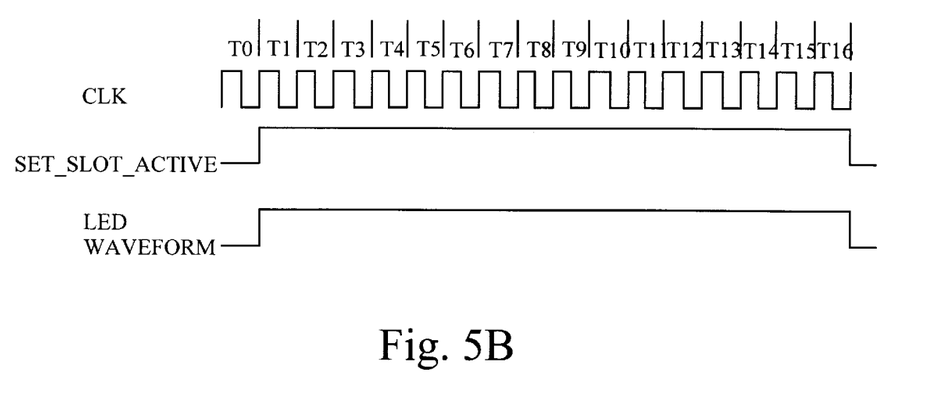

FIG. 5B also illustrates a single pulse representing a single transaction activity (signal set_slot_active), generated by one of the activity sensor circuits, which is provided as an input to an LED transform circuit in accordance with the present invention. However, unlike the transaction activity pulse in FIG. 5A, the transaction activity pulse here has a duration of sixteen (16) clock cycles. As a result, signal set_slot_active goes HIGH at time T1 in response to the transaction activity pulse. When counter 404 is reset after eight clock cycles, signal set_slot_active remains HIGH which causes the signals supplied to input R and S of RS-type latch 403 to remain at the previous state. Consequently, the LED waveform signal (the output of the LED transform circuit) remains HIGH for another 8 clock signals. This is so because counter 404 is set by the LED waveform signal for a second eight-clock-cycles count. At the end of the second eightclock-cycles count, signal set_slot_active goes LOW which causes the signals supplied to input R and S of RS-type latch 403 to switch state. Accordingly, counter 404 is reset, counter 405 is set, and the output of the LED transform circuit goes LOW.

Figure 5C:
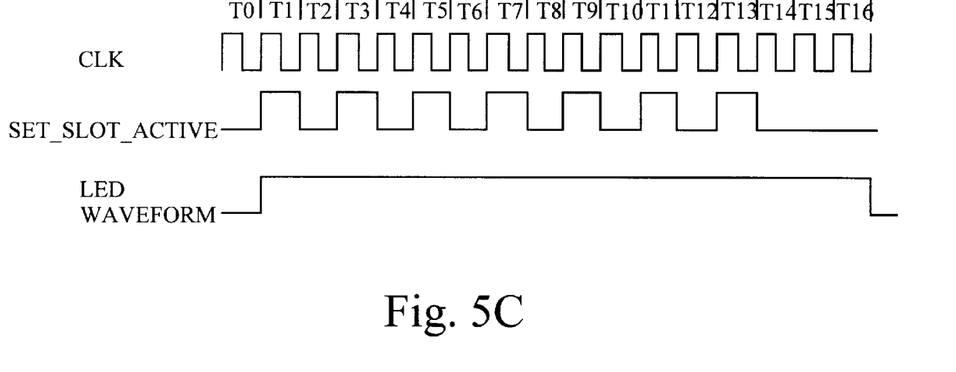

FIG. 5C illustrates a series of uniform duration pulses representing a series of transaction activities (signal set_slot_active), generated by one of the activity sensor circuits, which is provided as an input to an LED transform circuit in accordance with the present invention. As a result, signal set_slot_active goes HIGH at time T1 in response to the transaction activity pulse. When counter 404 is reset after eight clock cycles, signal set_slot_active is HIGH which causes the signals supplied to input R and S of RS-type latch 403 to remain at the previous state. Consequently, the LED waveform signal (the output of the LED transform circuit) remains HIGH for another 8 clock signals. This is so because counter 404 is set by the LED waveform signal for a second eight-clock-cycles count. At the end of the second eight-clock-cycles count, signal set_slot_active goes LOW which causes the signals supplied to input R and S of RS-type latch 403 to switch states. Accordingly, counter 404 is reset, counter 405 is set, and the output of the LED transform circuit goes LOW. As a result, instead of a series of pulses in close succession, the LED waveform signal is a long pulse thereby allowing the LED to stay lit for a longer period.

Figure 5D:
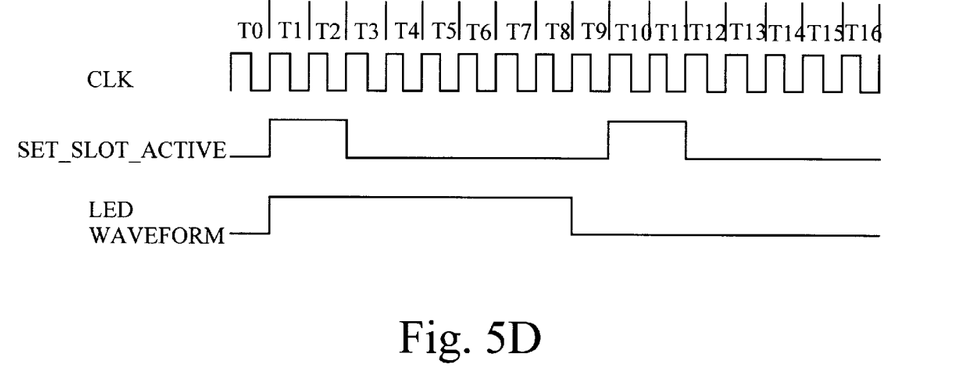

FIG. 5D illustrates two uniform duration pulses spaced rather far apart representing two transaction activities (signal set_slot_active), generated by one of the activity sensor circuits, which is provided as an input to an LED transform circuit in accordance with the present invention. As a result, signal_set_slot active goes HIGH at time T1 in response to the first transaction activity pulse. When counter 404 is reset after eight clock cycles, signal_set_slot active is LOW which causes the signals supplied to input R and S of RS-type latch 403 to switch states. Consequently, the LED waveform signal (the output of the LED transform circuit) goes LOW and stay LOW for eight clock signals. This is so because counter 404 is reset and counter 405 is set by the LED waveform signal starting at time T9. As illustrated in FIG. 5D, the second transaction activity pulse of set_slot_active signal is ignored even though it follows immediately after the eight clock cycles.

Figure 5E:
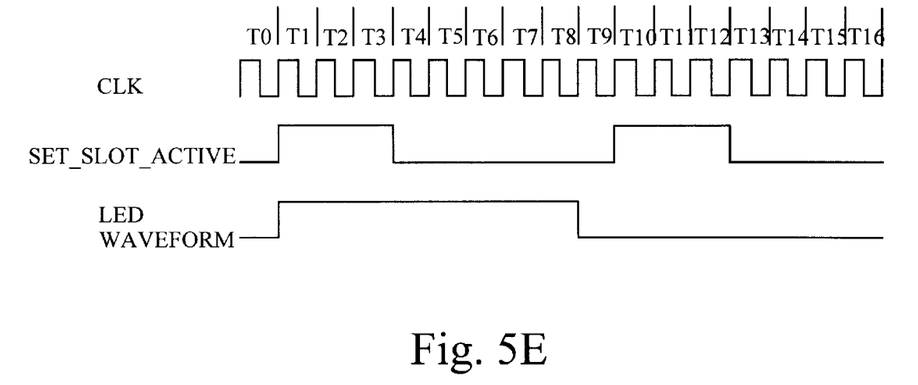

FIG. 5E illustrates two uniform duration pulses spaced rather far apart representing two transaction activities (signal set_slot_active), generated by one of the activity sensor circuits, which is provided as an input to an LED transform circuit in accordance with the present invention. As a result, signal set_slot_active goes HIGH at time T1 in response to the transaction activity pulse. When counter 404 is reset after eight clock cycles, signal set_slot_active is LOW which causes the signals supplied to input R and S of RS-type latch 403 to switch states. Consequently, the LED waveform signal (the output of the LED transform circuit) goes LOW and stays LOW for eight clock signals. This is so because counter 404 is reset and counter 405 is set by the LED waveform signal starting at time T9. As such, FIG. 5E is similar to FIG. 5D above. However, the difference between the two Figures is that the second pulse of set_slot_active signal comes a whole clock cycle after the eight-clock-cycle count of counter 404 expires. Hence, it is more clear as to why the second transaction activity pulse is ignored.

Figure 5F:
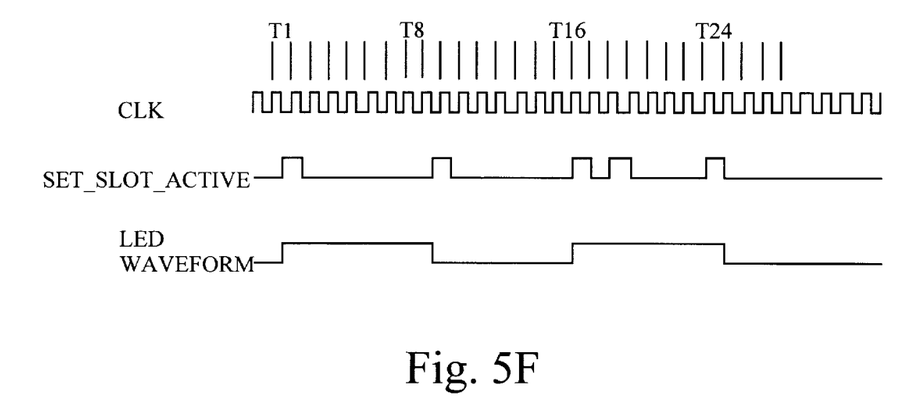

FIG. 5F illustrates a series of uniform duration pulses representing a series of transaction activities (signal set_slot_active), generated by one of the activity sensor circuits, which is provided as an input to an LED transform circuit in accordance with the present invention. The series of pulses occurs over an extended period of time wherein the pulses are spaced randomly apart much like the way transaction activities actually occur. In response to the first transaction activity pulse, signal set_slot_active goes HIGH at time T1. When counter 404 is reset after eight clock cycles, signal set_slot_active is LOW which causes the signals supplied to input R and S of RS-type latch 403 to switch states. Consequently, the LED waveform signal (the output of the LED transform circuit) goes LOW for eight clock signals. This is so because counter 405 is set by the LED waveform signal for eight clock cycles. At the end of the second eight-clock-cycles count, signal LED waveform signal goes HIGH in response to the third transaction activity pulse. Signal LED waveform signal remains HIGH for eight clock cycles. Accordingly, the fourth and fifth transaction activity pulses are ignored because they occur during the eight-clock-cycles count. At the end of the count, the LED waveform signal goes LOW. The randomly spaced series of pulses is replaced by two long pulses space far apart. In so doing, the LED is alternately lit for an visible period then goes low for a visible period.

Figure 6:
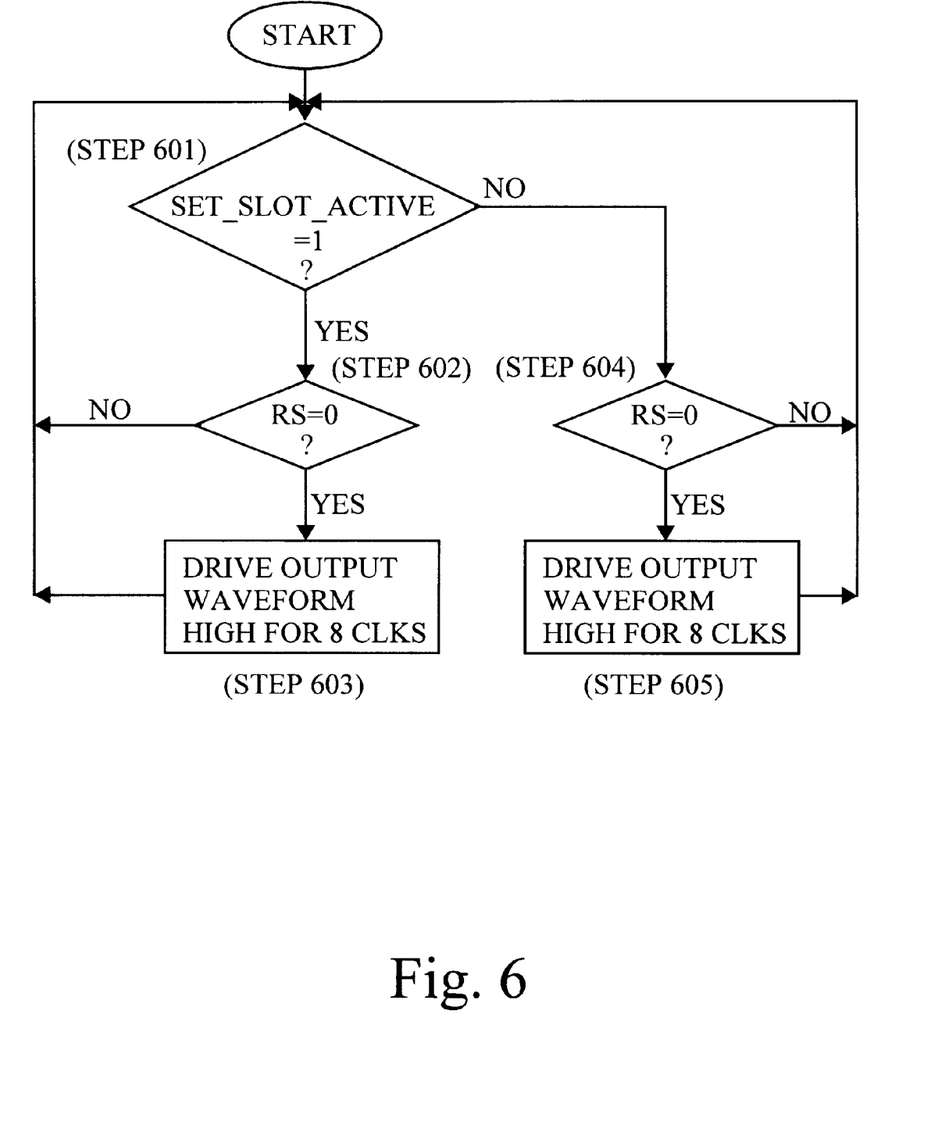
FIG. 6 illustrates a flow chart summarizing the logic in accordance to the present invention.

Referring now to FIG. 6 illustrating a flow chart summarizing the logic in accordance to the present invention. In step 601, it is determined whether there is any on-going transaction activity. In the preferred embodiment, this step is carried out by monitoring the set_slot_active signal. If the set_slot_activity signal is HIGH indicating there is an on-going transaction activity, it is determined whether or not an output LED waveform pulse is still occurring in step 602. Preferably, such determination can be made by checking the output of the RS-type latch. If the RS-type latch output is "one" (1) indicating that an on-going pulse is occurring in the waveform signal, control is transferred back to step 601 to continue monitoring on-going transaction activities. Otherwise, if the RS-type latch output is "zero" (0) indicating that there is no on-going pulse, the output waveform is driven HIGH for at least 8 clock cycles (step 603). Afterward, control is transferred back to step 601 to start the process anew.

Conversely, if the set_slot_active signal is LOW indicating that there is no on-going transaction activity, a determination, that is similar to step 602, of whether or not an output LED waveform pulse is occurring is still made in step 604. This determination is necessary because it is possible that the last of a LED waveform pulse is being outputted and the activity indicator has just been turned off. Steps 601–607 are then repeated. As in step 602, such determination can be made by checking the output of the RS-type latch. Similar to step 602, if the RS-type latch output is "one" (1) indicating that an on-going pulse is occurring, control is transferred back to step 601 to continue monitoring on-going transaction activities. Otherwise, if the RS-type latch output is "zero" (0) indicating that there is no on-going pulse, the output waveform is driven LOW for at least 8 clock cycles (step 605). Afterward, control is transferred back to step 601 to start the process anew.

The preferred embodiment of the present invention, a random waveform signal regulating circuit to reduce the LED flickering rate, is thus described. While the present invention has been described in particular embodiments, the present invention should not be construed as limited by such embodiments, but rather construed according to the below claims.

What is claimed is:

1. A waveform signal regulating circuit comprising:
   a sample-and-hold circuit receiving as input a transaction activity waveform signal;
   a latch coupled to the sample-and-hold circuit, the latch generating a regulated waveform signal at an output;
   wherein the sample-and-hold circuit detecting whether there is an on-going transaction activity, if there is an on-going transaction activity, the sample-and-hold detecting whether a pulse is occurring in the regulated waveform signal, if a pulse is not occurring in the regulated waveform signal, the sample-and-hold circuit signaling the latch to assert a first state in the regulated waveform signal for at least N clock cycles thereby controlling a pulse width, if there is no on-going transaction activity, the sample-and-hold circuit detecting whether a pulse is occurring in the regulated waveform signal, if a pulse is not occurring in the regulated waveform signal, the sample-and-hold circuit signaling the latch to assert a second state in the regulated waveform signal for at least M clock cycles thereby controlling a gap between two pulses;
   wherein the sample-and-hold circuit comprises a first counter coupled to the latch, the first counter monitoring a first count in response to the regulated waveform signal, the first counter generating a signal having the first state while the first count is less than the value N, the first counter generating the signal having a second state when the first count reaches the value N; a second counter coupled to the latch, the second counter monitoring a second count in response to a complementary of the regulated waveform signal, the second counter generating a signal having the first state while the second count is less than the value M, the second counter generating the signal having the second state when the second count reaches the value M; and a switching circuit receiving as inputs the waveform signal and the signals generated by the first and second counters, the switching circuit outputting first and second output signals generated by the first and second counters, the first and second output signals from the switching circuit provided as inputs to the latch; wherein the first and second counters start the first and second counts when the regulated waveform signal and the complementary of the regulated waveform signal are HIGH, the first and second counters reset the first and second counts when the regulated waveform signal and the complementary of the regulated waveform signal are LOW; and wherein the switching circuit comprises an AND-gate receiving as inputs the waveform signal and an invert of the signal generated by the second counter, the AND-gate providing as output the first output signal of the switching circuit; and a NOR-gate receiving as inputs the waveform signal and the signal generated by the first counter, the NOR-gate providing as output the second output signal of the switching circuit.

2. The waveform signal regulating circuit of claim 1, wherein the AND-gate further receiving as an input the invert of an enable signal which is asserted LOW in activating the waveform signal regulating circuit.

3. The waveform signal regulating circuit of claim 1, wherein the latch is a RS-type latch, the RS-type latch receiving the first output signal of the switching circuit at a S input, the RS-type latch receiving the second output signal of the switching circuit at a R input.

4. The waveform signal regulating circuit of claim 1, wherein the values N and M are equal to eight (8).

5. A computer system comprising:
   a host processor;
   a system memory;
   a PC card host adaptor; and
   a system bus coupling together the host processor, the system memory, and the PC card host adaptor;
   wherein the PC card host adapter comprises a waveform signal regulating circuit comprising:
      a sample-and-hold circuit receiving as input a transaction activity waveform signal;
      a latch coupled to the sample-and-hold circuit, the latch generating a regulated waveform signal at an output;
      wherein the sample-and-hold circuit detecting whether there is an on-going transaction activity, if there is an on-going transaction activity, the sample-and-hold detecting whether a pulse is occurring in the regulated waveform signal, if a pulse is not occurring in the regulated waveform signal, the sample-and-hold circuit signaling the latch to assert a first state in the regulated waveform signal for at least N clock cycles thereby controlling a pulse width, if there is no on-going transaction activity, the sample-and-hold circuit detecting whether a pulse is occurring in the regulated waveform signal, if a pulse is not occurring in the regulated waveform signal, the sample-andhold circuit signaling the latch to assert a second state in the regulated waveform signal for at least M clock cycles thereby controlling a gap between two pulses;

wherein the sample-and-hold circuit comprises a first counter coupled to the latch, the first counter monitoring a first count in response to the regulated waveform signal, the first counter generating a signal having the first state while the first count is less than the value N, the first counter generating the signal having a second state when the first count reaches the value N; a second counter coupled to the latch, the second counter monitoring a second count in response to a complementary of the regulated waveform signal, the second counter generating a signal having the first state while the second count is less than the value M, the second counter generating the signal having the second state when the second count reaches the value M; and a switching circuit receiving as inputs the waveform signal and the signals generated by the first and second counters, the switching circuit outputting first and second output signals generated by the first and second counters, the first and second output signals from the switching circuit provided as inputs to the latch; wherein the first and second counters start the first and second counts when the regulated waveform signal and the complementary of the regulated waveform signal are HIGH, the first and second counters reset the first and second counts when the regulated waveform signal and the complementary of the regulated waveform signal are LOW; and wherein the switching circuit comprises an AND-gate receiving as inputs the waveform signal and an invert of the signal generated by the second counter, the AND-gate providing as output the first output signal of the switching circuit; and a NOR-gate receiving as inputs the waveform signal and the signal generated by the first counter, the NOR-gate providing as output the second output signal of the switching circuit.

6. The computer system of claim 5, wherein the AND-gate further receiving as an input the invert of an enable signal which is asserted LOW in activating the waveform signal regulating circuit.

7. The computer system of claim 5, wherein the latch is a RS-type latch, the RS-type latch receiving the first output signal of the switching circuit at a S input, the RS-type latch receiving the second output signal of the switching circuit at a R input.

8. The computer system of claim 5, wherein the values N and M are equal to eight (8).

9. An apparatus for shaping random waveforms, comprising:

first and second counters individually reset each time after counting to a corresponding predetermined count; and a sample-and-hold having an input receiving a random waveform and an output providing a shaped waveform useful for driving a visible indicator indicating transaction activity on said random waveform, and coupled to said first and said second counters such that said shaped waveform is generated by sampling said random waveform each time one of said first and said second counters is reset and held while counting to said corresponding predetermined count;

wherein said first counter is coupled to said sample-and-hold so as to count to a first predetermined count if said random waveform is at a first logic level when sampled, and said second counter is coupled to said sample-and-hold so as to count to a second predetermined count if said random waveform is at a second logic level when sampled; and said sample-and-hold includes a latch having an output, and coupled to said first counter so as to initiate said first counter counting when said latch output is in a first logic state, and coupled to said second counter so as to initiate said second counter counting when said latch output is in a second logic state; and logic having an input receiving said random waveform, and coupled to said latch, said first counter, and said second counter such that said logic causes said latch output to be in said first logic state when said random waveform is at said first logic level when sampled, and said logic causes said latch output to be in said second logic state when said random waveform is at said second logic level when sampled.

10. The apparatus according to claim 9, wherein said logic comprises:

AND logic having a first input coupled to said random waveform, and a second input coupled to an inverted output of said second counter, wherein said output of said second counter indicates when said second counter is reset; and NOR logic having a first input coupled to said random waveform, and a second input coupled to an output of said first counter, wherein said output of said first counter indicates when said first counter is reset.

11. The apparatus according to claim 10, wherein said latch comprises an S-R latch having an S-input coupled to an output of said AND logic, an R-input coupled to an output of said NOR logic, a Q-output coupled to an enable input of said first counter, and a Q-bar-input coupled to an enable input of said second counter.

12. A method for shaping random waveforms, comprising:

(a) detecting transaction activity on a random waveform;

(b) if transaction activity is detected on said random waveform, generating a shaped waveform by holding said shaped waveform at a first logic level for a first predetermined count, then repeating steps (a) through (c); and (c) if transaction activity is not detected on said random waveform, generating said shaped waveform by holding said shaped waveform at a second logic level for a second predetermined count, then repeating steps (a) through (c).

13. The method according to claim 12, wherein (b) comprises: if transaction activity is detected on said random waveform, enabling said first counter to count to a first predetermined count while holding a shaped waveform at a first logic level, then repeating steps (a) through (c) after counting to said first predetermined count.

14. The method according to claim 12, wherein (c) comprises: if transaction activity is not detected on said random waveform, enabling a second counter to count to a second predetermined count while holding said shaped waveform at a second logic level, then repeating steps (a) through (c) after counting to said second predetermined count.

15. The method according to step 12, wherein a period in which said shaped waveform is at said first logic level directly correlates to a duration of said transaction activity.

16. The method according to step 12, wherein an interval between successive periods in which said shaped waveform is at said first logic level directly correlates to a time interval between successive transaction activities.

* * * * *